United States Patent [19]

Schertler et al.

[11] Patent Number: 5,571,331
[45] Date of Patent: Nov. 5, 1996

[54] VACUUM TREATMENT APPARATUS

[75] Inventors: Roman Schertler, Wolfurt, Austria; Paul-Rene Muralt, Sarraz, Switzerland

[73] Assignee: Balzers Aktiengesellschaft, Liechtenstein

[21] Appl. No.: 402,618

[22] Filed: Mar. 13, 1995

[30] Foreign Application Priority Data

Mar. 16, 1994 [DE] Germany .......................... 44 08 947.3

[51] Int. Cl.⁶ .................................................. C23C 16/00
[52] U.S. Cl. ........................... 118/719; 118/729; 118/730; 204/298.07
[58] Field of Search .................... 118/719, 729, 118/730, 728; 156/345; 204/298.07, 298.33

[56] References Cited

U.S. PATENT DOCUMENTS

| | | | |
|---|---|---|---|
| 5,439,547 | 8/1995 | Kumagai | 156/345 |
| 5,470,784 | 11/1995 | Coleman | 437/101 |
| 5,474,410 | 12/1995 | Ozawa et al. | 414/217 |
| 5,474,641 | 12/1995 | Otsuki et al. | 156/345 |
| 5,503,675 | 4/1996 | Zejda | 118/719 |
| 5,505,779 | 4/1996 | Mizuno et al. | 118/719 |
| 5,515,986 | 5/1996 | Turlot et al. | 216/71 |

FOREIGN PATENT DOCUMENTS

| | | | |
|---|---|---|---|
| 1696095 | 12/1972 | Germany | 118/719 |
| 8420715 | 8/1987 | Germany . | |
| 3827343 | 8/1988 | Germany . | |
| 4009603 | 3/1990 | Germany . | |
| 4235677 | 10/1992 | Germany . | |
| 3087386 | 4/1991 | Japan | 118/719 |
| 403283618 | 12/1991 | Japan | 118/719 |
| 0092520 | 5/1994 | Japan | 118/719 |

*Primary Examiner*—R. Bruce Breneman
*Assistant Examiner*—Joni Y. Chang
*Attorney, Agent, or Firm*—Notaro & Michalos

[57] ABSTRACT

Vacuum treatment apparatus including at least two chambers that are linked by a transit opening. A valve body pivotally linked within the opening pivots around a pivot axis that is disposed transversely in the opening. A drive for pivoting the valve body around the pivot axis also provided. The valve body has at least one workpiece carrier to be transported by pivoting the valve body around the pivot axis between the two chambers. An expandable seal arrangement is provided around the opening. The seal arrangement is expandable by pressure of a pressurizing medium, so as to seal the body against the opening in dependency of the pressure of the pressurizing medium.

18 Claims, 3 Drawing Sheets

VACUUM TREATMENT APPARATUS

BACKGROUND OF THE INVENTION

1. Field of the Invention

The present invention is generally directed to a technique for conveying at least one workpiece at a time from one vacuum chamber into a second vacuum chamber of a vacuum treatment apparatus. Thereby, and as will be described as a preferred example, one of the two chambers may be a load lock chamber, whereby the second of the two chambers is, as a preferred example, too, a treatment chamber wherein workpieces are subjected to a vacuum treatment at one or more than one treatment stations, as e.g. for physical vapour deposition (PVD), plasma enhanced chemical vapour deposition (PECVD) or chemical vapour deposition (CVD) processes, or where the workpieces are heated as e.g. for degasing the workpieces before subjecting them to further treatment.

2. Description of Prior Art

E.g. from the prospectus of the applicant, Balzers AG, "Load Lock Sputtering System LLS 801", BB 800 240 PE (8403), it is known to provide at such vacuum treatment apparatus a workpiece holder cylinder, a so-called substrate basket which is introduced into a load lock chamber with untreated substrates. After introduction of the substrate basket into the load lock chamber, the latter is evacuated. The two chambers are linked via a transit opening. There is provided a sliding valve in the transit opening so as to separate the load lock chamber from the treatment chamber.

Definition

If reference is made to "closing a transit opening between two vacuum chambers" throughout this description, this shall mean a vacuum technical separation of the two chambers, be it via a diffusion gap seal or by form-locking and/or force-locking sealing arrangements. The necessary degree of shutting off the two chambers by closing the transit opening is exclusively governed by the respective requirements for the two chamber treatment atmospheres.

After evacuation and possibly after pretreatment of the workpieces or substrates in the load lock chamber, the substrate basket is introduced through the transit opening into the processing chamber where vacuum treatment of the workpieces occurs. Thereafter, the substrate basket is conveyed back into the load lock chamber and is finally removed from the load lock chamber and exchanged by a successive substrate basket loaded with yet untreated substrates or workpieces.

It is a drawback of such apparatus that the load lock chamber must be large and that during the treatment-timespan the load lock chamber remains unused. This because introduction of a substrate basket with untreated workpieces into the load lock chamber during processing workpieces in the treatment chamber would prevent the substrate basket, yet under treatment, to be conveyed back from the treatment chamber into the load lock chamber.

From the German laid open print no. 25 29 018 it is known to provide between load lock chambers and treatment chambers an additional transport chamber, wherein workpieces are disposed on plungers and wherein the plungers form both workpiece transport means and sealing elements for the transit openings. A drawback of such treatment apparatus is that an additional transport chamber must be provided with expensive and complicated transport arrangements.

From the Japanese patent application no. 58-153345 it is known to provide in a transit opening between two vacuum chambers a valve body which is pivoted around an axis which is disposed transverse to the opening. The valve body comprises a workpiece support remote from the pivoting axis, so that, by pivoting the valve body around the pivot axis, the workpiece support is moved along a rotational path from one into the other chamber or vice-versa. The opening frame is thereby formed by two sections of cylindrical surface situated opposite each other. Between these cylindric surface sections the rotor-like valve body is provided. Sealing between the two chambers is realized by relatively long gaps between the transit opening frame and the pivotable valve body.

From the German utility model no. 84 20 715.9 it is known to provide within a transit opening linking two vacuum chambers a circular plate pivotable around an axis disposed transverse to the opening. Again, the plate as a valve body carries a workpiece support which is brought from one into the other chamber and vice-versa by pivoting the valve plate. Sealing between the two chambers is performed by seals all around the periphery of the valve body plate or disk, which interact with sealing surfaces of an annular opening frame defining the transit opening.

It is a drawback of such known vacuum treatment apparatus, which comprise at least two chambers linked by a transit opening and have a valve body pivotably linked within such opening to pivote around a pivot axis being disposed transverse to the opening, whereby the valve body comprises at least one workpiece carrier to be transported by pivoting said valve body around the pivote axis between the at least two chambers, that sealing is either performed by a gap sealing which sealing may be not effective enough for separating the chambers, e.g. if one of the chambers is a load lock chamber between process atmosphere and ambient atmosphere, or that with form and/or force seals the problem of abuse and relatively short lifetime of such seals occurs, and, additionally, the problem of friction, in that by pivoting such valve body the form and force seal elements are brought into sealing position under friction.

Further, it is not possible at such known techniques to select that degree of sealing between the two chambers, which is appropriate for a specific process for the workpieces.

SUMMARY OF THE INVENTION

It is an object of the present invention to provide a vacuum treatment apparatus of the type which comprises at least two chambers linked by a transit opening and having a valve body pivotably linked within such opening to pivote around a pivot axis being disposed transverse to the opening, whereby the valve body comprises at least one workpiece carrier to be transported by pivoting said valve body around said pivot axis between the at least two chambers, at which vacuum treatment apparatus separation of the two chambers is realized, so that the danger of frictional contamination is significantly reduced and the degree of closing the transit opening may easily be selected according to the specific process requirements. By reduction of friction, the lifetime of the seal shall considerably be improved.

This object is resolved in that an expandable seal arrangement is provided around at least one of the valve body and of the opening frame, whereby the seal arrangement is expandable by pressure of a pressurizing medium, so as to seal the body against the opening frame in dependency of the pressure of pressurizing medium. Thereby, release of the seal is preferably performed by elasticity of the seal element when pressure is released.

With respect to expandable seals in general, attention is drawn to the FR-A-1 199 817, to the UK-A-2 152 195 and to the EP-A-0 555 764 of the present applicant, which accords with the U.S. application Ser. No. 08/015,601. With respect to possible realization of such expandable and retractable seal arrangements, the said EP-A-0 555 764 or its US counterpart shall form integrated part of the present description.

It is a further object of the present invention to tailor the valve body so as to be apt to easily carry at least one workpiece carrier, which object is resolved by providing the valve body as a valve plate.

It is a further object of the invention to provide the vacuum treatment apparatus at least in one of the chambers with a workpiece transport arrangement, so that a workpiece conveyed into such chamber by means of the valve body pivoting movement may be further conveyed into selected positions. This is reached by providing a linearly movable workpiece transport arrangement, which is mounted in one of the two chambers or, and preferably, on the valve body itself. Utmost flexibility with respect to further conveying workpieces, once transported into one of the two chambers by means of the valve body, is reached as a further object of the present invention by providing a workpiece transport arrangement which is drivingly mounted rotatably around an axis and which comprises at least two workpiece supports distant from the axis where-around the transport arrangement is drivingly rotatable, and whereby the transport arrangement is mounted in one of the two chambers or, and as preferred, on the valve body itself.

Even further improved flexibility in bringing the workpieces into specified positions in one of the two chambers or removing them therefrom to be conveyed by valve body pivotement is reached in that the inventive apparatus comprises a workpiece transport arrangement which is drivingly movable linearly along an axis and which is rotatable around this axis, whereby the transport arrangement comprises at least two workpiece supports arranged distant from the axis, whereby the transport arrangement is mounted in one of the two chambers or, and as preferred, on the valve body itself.

It is a further object of the present invention to provide the inventive apparatus with the ability of easily introducing workpieces from ambient into process atmosphere, whereby a load lock chamber is better exploited, i.e. in that charging of the load lock chamber with untreated workpieces may occur during processing of already formerly introduced workpieces. This is achieved by the inventive apparatus, wherein one of the two chambers is a load lock chamber communicating with ambient atmosphere via a further opening.

It is a further object of the present invention to provide the inventive treatment apparatus with at least two workpiece treatment stations and to convey the workpieces into treatment position with fewest possible transport movements and with short transport movements. This is reached by the said apparatus, wherein at least one of the two chambers is a workpiece treatment chamber with at least two workpiece treatment stations and which further comprises a workpiece transport arrangement on the valve body which comprises at least two workpiece carriers and whereby the workpiece transport arrangement is mounted on said valve body to be drivingly rotatable around an axis, so as to bring the at least two workpiece carriers of the transport arrangement into angular alignment with the at least two treatment stations in one of the two chambers.

In a preferred realization form, the seal arrangement, which is expandable by pressure of a pressurizing medium, comprises at least one elastomeric expandable tube which extends either all around the valve body and/or the opening frame or which extends at least along sections around said valve body and/or said opening frame.

In a second preferred form, the seal arrangement comprises at least one expandable bellows extending all around the valve body and/or all around the opening frame or which extends along sections of the body and/or of the opening frame, whereby provision of elastomeric expandable tubes and expandable bellows may be combined or whereby a sealing tube may be formed by a bellows section and an elastomeric section, considered in cross-section.

Thereby, different expansion and retraction characteristics depending on the pressure applied to the expandable and retractable seal arrangement may be realized. The expandable and retractable seal arrangement is preferably operated pneumatically.

It is a further object of the present invention to provide a vacuum treatment apparatus with at least two chambers linked by a transit opening at which processing may be performed in one chamber, and simultaneously loading or unloading of workpieces to and from the apparatus may be performed in the other chamber, whereby simultaneously a batch of workpieces is treated, loaded and unloaded.

This object is resolved by providing a valve body pivotably linked within the transit opening to pivote around a pivote axis, being disposed transverse in the opening, and a drive for pivoting the valve body around the pivote axis, whereby the valve body comprises at least one workpiece carrier to be transported by pivoting the valve body around the pivote axis. Thereby, the workpiece carrier is a batch workpiece carrier for a multitude of workpieces, which may be removably linked to the valve body.

A further object of the invention is to allow the pivoting movement of the valve body with the batch workpiece carrier thereon, thereby conveying the batch workpiece carrier at least in one of the chambers into processing position. This is realized by providing the batch workpiece carrier linearly movable on the valve body along an axis, which is wharped, and thereby preferably which is perpendicular to the pivote axis, and by providing a linear drive acting between the valve body and the batch workpiece carrier.

It is a further object to apply a large number of workpieces to the mentioned batch workpiece carrier and to position such workpieces in at least one of the chambers, so that there a number of treatment stations may be applied, whereby the workpieces on the batch workpiece carrier may be easily brought into treatment position with respect to the treatment stations. Thereby, either each of the workpieces is brought in a treatment position with respect to one respective treatment station or one workpiece is successively brought into respective treatment positions at different treatment stations.

To fulfil this object, the batch workpiece carrier defines a cylindric surface with a cylinder axis perpendicular to the pivote axis. Thereby, substantially flat surface workpieces may be arranged with their substantially flat surface substantially in such cylindric surface or forming an angle with respect to said cylindric surface. The batch workpiece carrier may thereby have the form of a cylindric basket and such cylindric workpiece carrier may be, additionally to its linear movability with respect to the valve body, rotated around its axis to successively bring the workpieces into treatment positions at different treatment stations.

Thereby, at least one chamber of the inventive apparatus comprises at least two, preferably several treatment stations arranged along an annular locus coaxially to the axis of said cylindric batch workpiece carrier, once said batch workpiece carrier is brought and stationarily held in said chamber considered by means of the pivoting valve body.

By linear movement of the batch workpiece carrier, its cylindric surface with the workpieces thereon is axially brought onto the said locus with the treatment stations, and the workpieces are treated separately at respective treatment stations or are successively treated at different treatment stations, in that the cylindric batch workpiece carrier is rotated around the cylindric surface's axis.

Other objects, advantages and preferred features of the inventive vacuum treatment apparatus will become evident to the man skilled in this art when reading the detailed description and claims.

BRIEF DESCRIPTION OF THE DRAWINGS

The present invention, under all its aspects, will thus be better understood and objects other than those set forth above will become apparent to the man skilled in the art, when consideration is given to the following detailed description thereof.

Such description makes reference to the annexed drawings, wherein

In FIG. 1 there is schematically shown the most important part of the inventive vacuum treatment apparatus, which comprises a first chamber 1 and a second chamber 3 which communicate via a transit opening 5 extending, according to the representation of FIG. 1, perpendicularly to the plane of the drawing. As a part of a transport arrangement provided for conveying workpieces at least in one direction through transit opening 5, e.g. from chamber 1 to chamber 3, there is provided a valve body 7, which is construed symmetrical with respect to a pivote axis S. The valve body 7 is pivotable around the pivot axis S by means of a drive 9.

Dependent from the shape of the opening frame, the valve body may be a cylindric body 7a or a rectangular plate or a ball 7b or a circular plate etc. The transit opening is closed at least in specified positions of the valve body 7. Thus, a plate will close the transit opening periodically every 180° pivoting angle and a cylinder or a ball shaped valve body will permanently close the transit opening irrespective of the pivoting angle.

Figure 1:
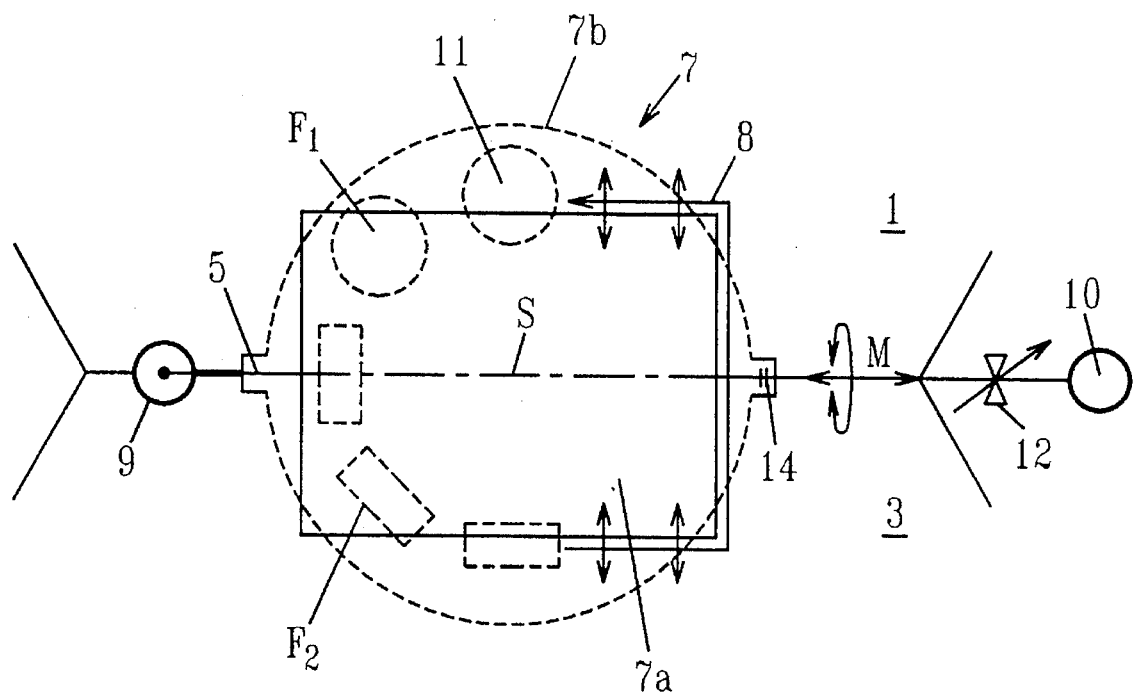
FIG. 1 schematically shows a part of an inventive vacuum treatment apparatus with the inventive valve and sealing arrangement for explaining the inventive principle.

As shown in FIG. 1, at a part of the cylindric or rectangular plate shaped valve body 7a, there is provided an expandable and retractable seal arrangement 8 at the outermost area of the valve body 7a. The seal arrangement 7 is principally formed by a tube like structure which is expandable by pressurizing its inside by means of a pressurizing medium, preferably pneumatically. The seal arrangement, therefore, is construed by either one or by a combination of elastomeric tube walls and of expandable bellows walls.

As shown in FIG. 1, the sealing arrangement 8 may be provided on the valve body 7a, whereby, in such case, pressurizing medium M is fed from a pressurizing source 10 via a controlling valve 12 through a sealed rotational feedthrough 14 along the pivote axis S to the expandable tubing of seal arrangement 8. In addition or instead of such seal arrangement along the valve body, the seal arrangement may be provided along the opening frame, so that applying the pressurizing medium may be performed without any moving feed-throughs. The seal arrangement on the valve body 7 acts radially outwards with respect to the pivote axis S to perform sealing action, whereas a sealing arrangement provided along the stationar opening frame acts radially inwards with respect to that axis S to perform sealing action.

Dependent on the elastic expansion characteristic of the sealing arrangement and of its sealing surface brought into contact with the counter surface, be it the valve body or the stationar opening frame, by means of selecting the operating pressure of the pressurizing medium, the degree of seal may easily be selected and adjusted. For movement of the valve body to transport workpieces from one to the other chamber, the pressure of the pressurizing medium to the expandable seal arrangement is released, so that the elastic characteristic of the seal arrangement retracts the sealing surface from its counterpart. Thus, no friction will occur during valve body pivote movement, and thus the danger of frictional particles contaminating the chambers is banned.

Figure 2:
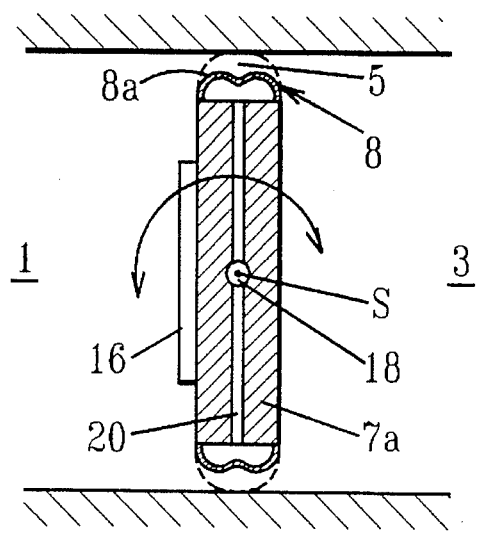
FIG. 2 shows schematically a cross section through a valve body according to FIG. 1 with an enlarged expandable and retractable sealing arrangement.

In FIG. 2, there is schematically shown a valve body 7a formed as a plate with a substrate holder 16. The sealing arrangement 8 comprises an at least in part expandable tube 8a around the periphery of the body 7a, which is pressurized through a line 18 along pivoting axis S and via radially extending distributing line 20. By means of raising pressure in the lines 18 and 20, the expandable seal arrangement is expanded radially outwards to contact the counter surface of the opening frame 5 between the chambers 1 and 3 to a degree selected by the selected pressure. For moving the body 7a, the pressure is reduced, so that the seal arrangement disengages the frame surface. If desired, such expandable seal may be provided on the valve body and the opening frame, possibly some angular section of the seal on the valve body and some on the frame, forming, in combination, a seal arrangement all along the frame.

Turning back to FIG. 1, it may be seen that workpieces 11, e.g. in chamber 1, are loaded on the valve body 7 and are conveyed by pivoting the valve body 7 around axis S into chamber 3. Backtransport from chamber 3 into chamber 1 is performed analogically. An essential feature in this conveying technique is that simultaneously with transporting workpieces from chamber 1 to chamber 3, workpieces may be transported from chamber 3 to chamber 1.

In the following description, the valve body 7 is described as having the shape of a plate. Thereby, the pivote axis S is located substantially parallel to the plane of the plate. As shown in FIG. 1, surfaces F to be treated of workpieces 11 may be arranged on such a plate shaped valve body to be parallel to the plane of the plate, as shown in $F_1$, or may be arranged perpendicularly thereto, as shown by $F_2$ in FIG. 1.

Figure 3:
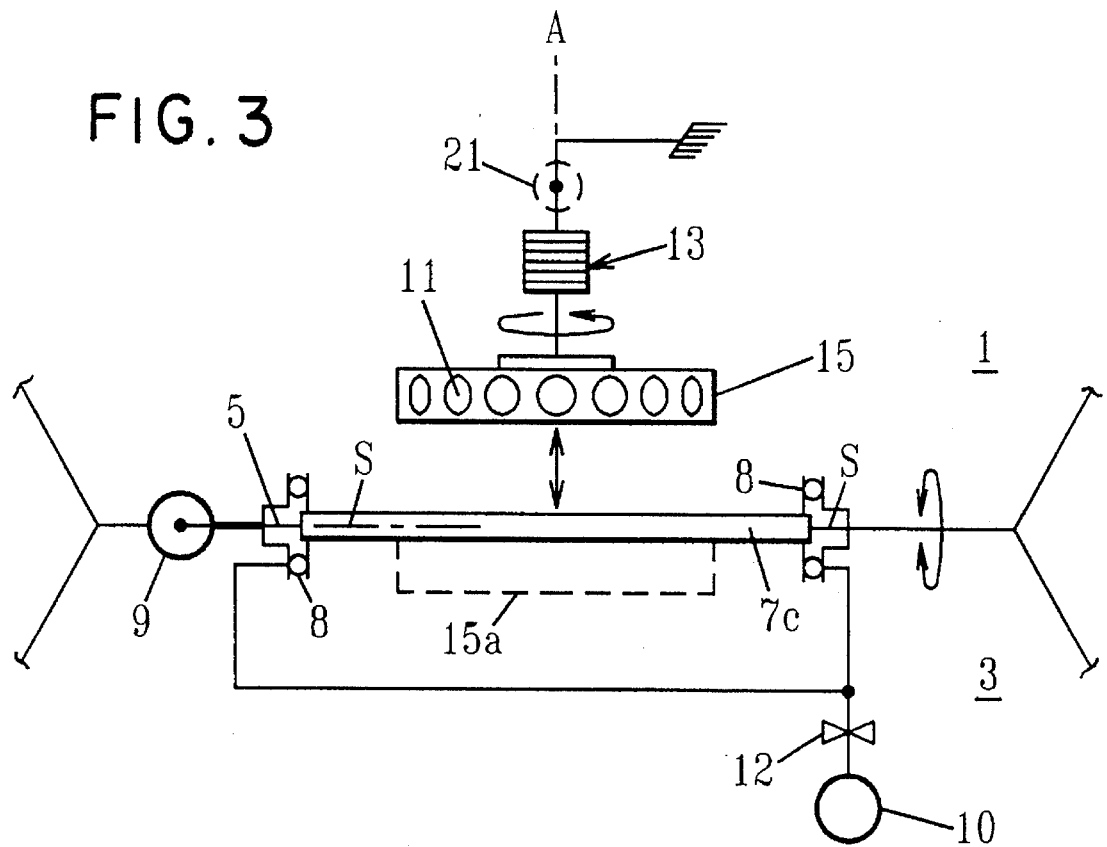
FIG. 3 shows, departing from the representation of FIG. 1, a further embodiment of the inventive vacuum treatment apparatus.

In FIG. 3, the plate shaped valve body 7c is shown in a position closing the transit opening 5. Here, the sealing arrangement 8 is mounted around the frame of opening 5, i.e. stationar, and is fed by the pressurizing source 10 via valve 12.

In at least one of the chambers 1 and 3, and as shown in FIG. 3 in chamber 1, there is provided a linearly movable workpiece transport arrangement 13 by which workpieces, as shown e.g. a cylindric workpiece basket 15 with workpieces 11, may be conveyed from the valve body 7c or may be retrieved towards this body 7c. The plate shaped valve body 7 comprises holding members, as e.g. permanent magnet or electro-magnet driven holders (not shown), so as to seize the basket 15 from the transport arrangement 13 or so as to deliver this basket to the transport arrangement 13.

In dashed lines at 15a, there is shown the position of the basket 15 after that the plate shaped body 7c has been pivoted by 180° around pivoting axis S. Linearly movable transport arrangements as shown at 13 may be provided in both chambers 1 and 3.

Figure 4:
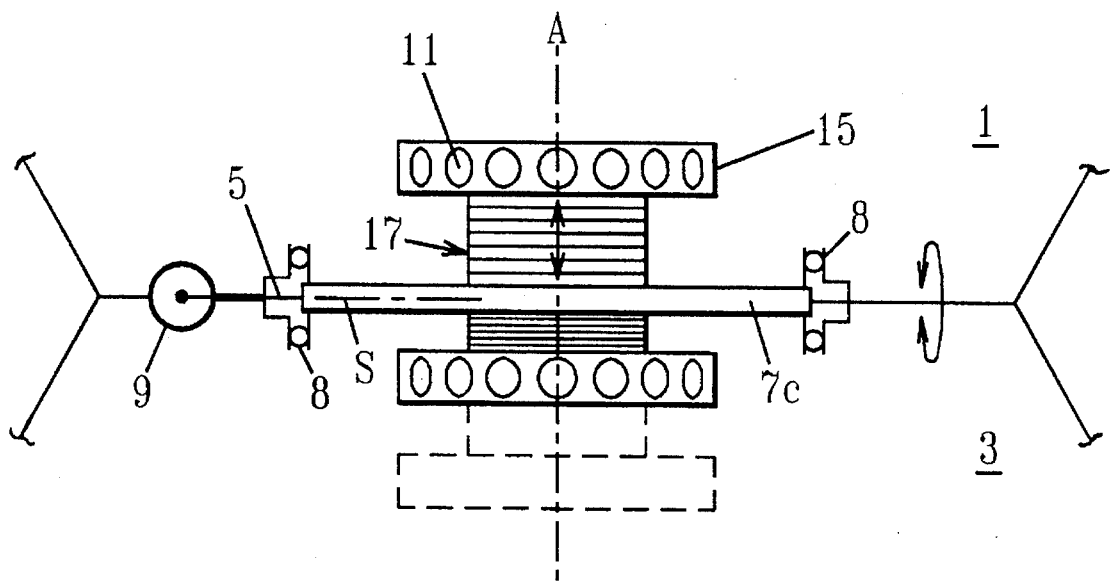
FIG. 4 shows a still further realization form of the inventive vacuum treatment apparatus.

A further embodiment departing from that shown in FIG. 3 is shown in FIG. 4. Here, the linearly movable transport arrangement is mounted on the valve body 7c itself and is encapsulated by means of a bellows arrangement 17. Workpieces, as e.g. in basket 15, are seized from a feeding robot or feeding transport arrangement (not shown), are retrieved towards the body 7c, and by means of pivoting body 7c around axis S, as shown in FIG. 4, they are conveyed into chamber 3.

By expanding the linear transport arrangement within the bellows 17, the workpieces, as e.g. at basket 15, are conveyed in a desired position within chamber 3, as shown in FIG. 4 with dashed lines. In FIG. 4, again, the expandable seal arrangement is mounted stationarily at the frame of transit opening 5.

As has been shown, the workpieces in at least one of the two chambers are retracted from a first position remote from the pivot axis S in at least one of the two chambers back towards rotational axis S on the valve body to then be conveyed by pivoting the body around the pivot axis S into the other chamber. Thereby, as was said, one of the two chambers may be a load lock chamber communicating with ambient atmosphere, whereby the sealing arrangement 8 performs separation of load lock chamber from the further chamber, as especially from a treatment chamber.

By means of the FIGS. 3 and 4, a further preferred embodiment of the inventive apparatus shall be explained. As shown in dashed lines at 20 in FIG. 3, there is provided at the linearly movable transport arrangement 13 a rotational drive 20, so that the basket 15 with the workpieces 11 may be driven to rotate by selected angles around axis A. This is especially advantageous in a treatment chamber, in which the workpieces shall sequentially be brought and aligned with two or more treatment stations radially arranged around axis A.

In the embodiment of FIG. 4, this is realized in that the basket 15 or the basket 15 commonly with a circular valve body 7c is rotated around axis A, either continuously or in steps. Drive for the valve body 7c for such rotational movement around axis A may be performed by means of a magnetic step-motor which acts between the frame of the opening 5 and the periphery of body 7. In this manner, too, the workpieces, as e.g. at the basket 15, may sequentially be rotated around axis A and thus be fed to treatment stations in one of the two chambers, e.g. in chamber 3.

Also a combination of the techniques according to FIG. 3 and according to FIG. 4 is possible, in that e.g. the linear drive is realized according to FIG. 3, mounted in one of the chambers, and the rotating drive around axis A is realized on the body 7c.

Figure 5:
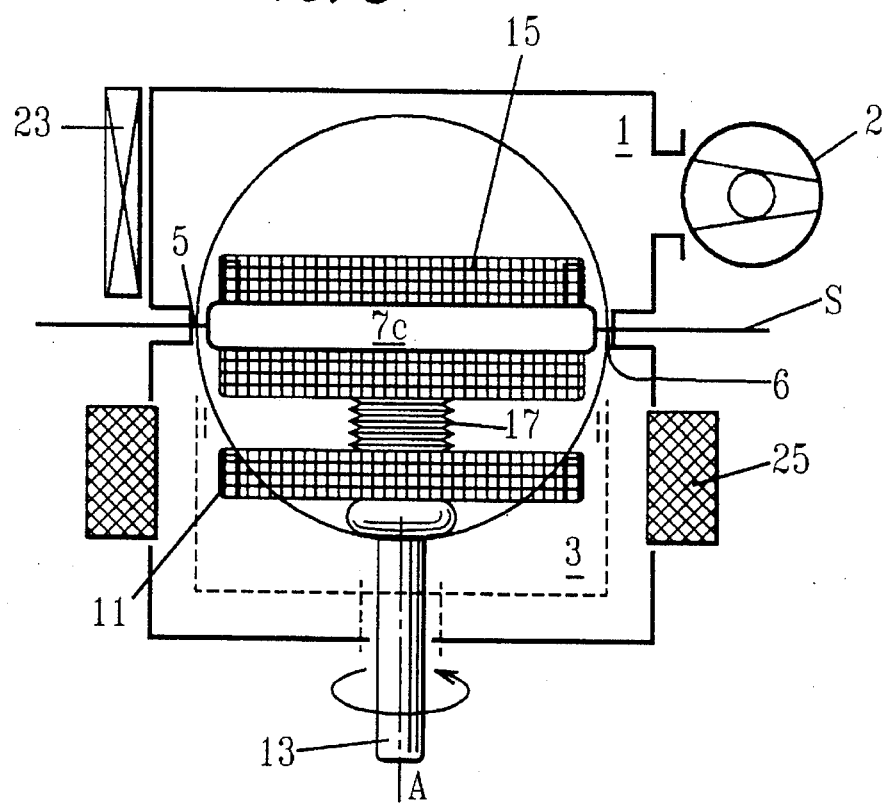
FIG. 5 schematically shows a side view of a still further and preferred inventive vacuum treatment apparatus and FIG. 6 shows schematically the top view on the apparatus according to FIG. 5.
Figure 6:
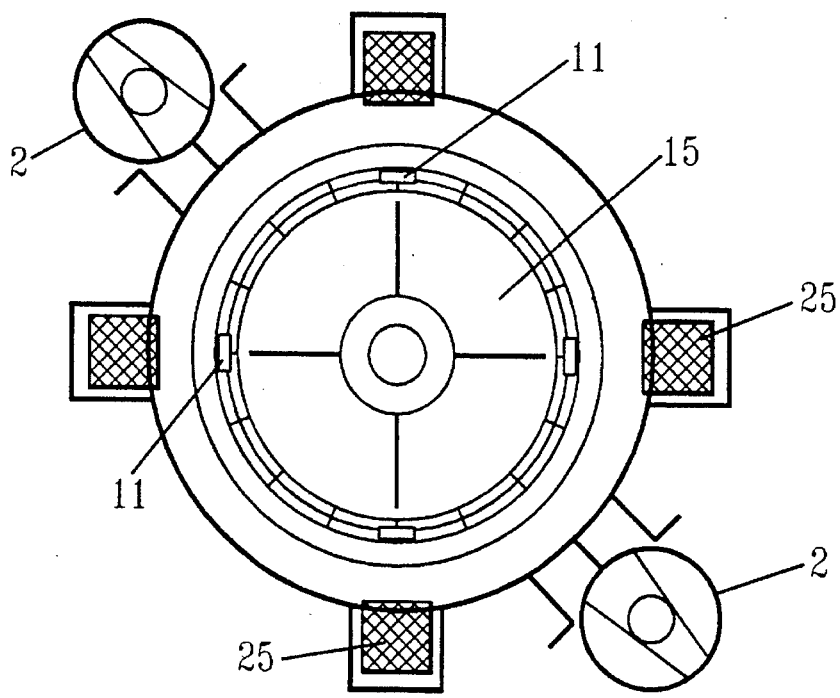

In the FIGS. 5 and 6, there is shown a today preferred realization form of an inventive vacuum treatment apparatus. So as to show the analogy to the embodiment shown in the FIGS. 1 to 4, as far as possible, the same reference numbers have been introduced.

The substrate basket 15 is introduced through an input/output valve 23 into the first chamber 1, which is a load lock chamber. Thereby, the valve body plate 7c has been brought in a position shutting off the transit opening 5 and the expandable sealing arrangement (not shown in the FIGS. 5 and 6) is pressurized to instal a seal between load lock chamber 1 and chamber 3. The basket 15 is disposed on the valve body plate 7c and held in position, e.g. by a magnet arrangement (not shown). Subsequently, and after shutting input/output valve 23 and after evacuating chamber 1 by pump 2, the seal between plate 7c and the opening frame 6 is released and the valve body plate 7c together with the basket 15 and the workpieces 11 to be treated are pivoted into chamber 3. There, by means of a separate linear transport arrangement 13 or by means of a linear transport arrangement 17 mounted between plate 7c and the workpiece basket 15, the basket 15 with the workpieces 11 is shifted, as shown, into a treatment position remote from the body plate 7c.

At the periphery of the chamber 3, and as shown as an example, at least two, e.g. four treatment stations 25 are provided, as e.g. an etching, a heating and a coating station. By rotating the transport arrangement 13 (mounted in chamber 3) or 17 (mounted on the valve body 7c), the workpieces 11 are sequentially conveyed into treatment positions with respect to the treatment stations 25. During this time, the formerly free surface of the plate 7c, which is now disposed in chamber 1, i.e. in the load lock chamber, is loaded with a further basket with yet untreated workpieces 11. Thereby, the radial seal arrangement separates the two chambers 1 and 3.

After treatment of the workpieces and loading of untreated workpieces, pivoting of the valve body 7c conveys treated workpieces into load lock chamber 1 and yet untreated workpieces from load lock chamber 1 into treatment chamber 3.

The inventively provided, with respect to pivot axis S primarily radially acting expandable elastic seal arrangement may be realized by elastomeric walls or even pipes and/or by bellows, even combined by bellows wall parts and elastomeric wall parts. As pressurizing medium preferably a gas, as e.g. air, is used or possibly a liquid pressurizing medium.

By providing additional spring means, retraction of the sealing members may be improved beyond the spring characteristic of the bellows or of elastomeric material itself.

We claim:

1. Vacuum treatment apparatus, comprising at least two chambers linked by a transit opening, a valve body pivotably linked within said opening to pivote around a pivot axis being disposed transverse in said opening, a drive for pivoting said valve body around said pivot axis, whereby said valve body comprises at least one workpiece carrier to be transported by pivoting said valve body around said pivote axis between said at least two chambers an expandable seal arrangement around said opening, at least one of at said body and of at said opening, said seal arrangement being expandable by pressure of a pressurizing medium, so as to seal said body against said opening in dependency of said pressure of said pressurizing medium.

2. The apparatus of claim 1, wherein said valve body is a valve plate.

3. The apparatus of claim 1, further comprising a linearly movable workpiece transport arrangement being mounted one of in one of said two chambers and of on said valve body.

4. The apparatus of claim 1, comprising a workpiece transport arrangement being drivingly mounted rotatably around an axis and comprising at least two workpiece supports distant from said axis, said transport arrangement being mounted one of in one of said chambers and of on said valve body.

5. The apparatus of claim 1, further comprising a workpiece transport arrangement drivingly movable linearly along and rotatable around an axis, said workpiece transport arrangement comprising at least two workpiece supports arranged distant from said axis and being mounted one of in one of said two chambers and of on said valve body.

6. The apparatus of claim 1, wherein one of said two chambers is a load lock chamber communicating with ambient atmosphere via a further closable opening.

7. The apparatus of claim 1, wherein at least one of said two chambers is a workpiece treatment chamber with at least two workpiece treatment stations and further comprising a workpiece transport arrangement mounted on said valve body and comprising at least two workpiece carriers, said workpiece transport arrangement on said valve body being mounted to be at least one of drivingly rotatable around an axis to bring said at least two workpiece carriers into angular alignment with said at least two treatment stations and of linearly movable along said axis.

8. The apparatus of claim 1, wherein said valve body is drivingly rotatable around a rotating axis in said opening and comprises at least two workpiece holders arranged on said valve body distant from said rotational axis.

9. The apparatus of claim 1, wherein said seal arrangement comprises at least one elastomeric expandable tube wall.

10. The apparatus of claim 1, wherein said seal arrangement comprises at least one expandable bellows wall.

11. The apparatus of claim 1, wherein said seal arrangement is pneumatically expandable.

12. A vacuum treatment apparatus, comprising at least two chambers linked by a transit opening, a valve body pivotably linked within said opening to pivote around an axis being disposed transverse in said opening, a drive for pivoting said valve body around said pivote axis, whereby said valve body comprises at least one workpiece carrier to be transported by pivoting the valve body around the pivoe axis, said workpiece carrier being a batch workpiece carrier for a multitude of workpieces.

13. The vacuum treatment apparatus of claim 12, wherein said batch workpiece carrier is linearly movably linked to said valve body and there is provided a linear drive acting between said valve body and said batch workpiece carrier.

14. The apparatus of claim 12, wherein said batch workpiece carrier defines a cylindric surface with workpiece supports and wherein the axis of said cylindric surface is wharped with respect to said pivote axis.

15. The apparatus of claim 14, wherein said axis of said cylindric surface is perpendicular to said pivote axis.

16. The apparatus of claim 14, wherein at least one of said two chambers comprises at least two treatment stations arranged along a circular locus coaxially to the axis of said cylindric surface positioned in said at least one chamber by said valve body.

17. The vacuum treatment chamber of claim 12, wherein said batch workpiece carrier is drivingly rotatable in a plane perpendicular to direction of said linear movement.

18. The apparatus of claim 12, wherein an expandable seal arrangement is provided around said opening, at least one of at said valve body and of at said opening, said seal arrangement being expandable by pressure of a pressurizing medium, so as to seal said body against said opening in dependency of said pressure of said pressurizing medium.

* * * * *